United States Patent [19]

Takaoka et al.

[11] 4,328,465
[45] * May 4, 1982

[54] TONE CONTROL CIRCUIT UTILIZING VARIABLE GAIN AMPLIFIER

[75] Inventors: Saburo Takaoka; Ryozi Higashi; Hiroyuki Hirano, all of Tokorozawa, Japan

[73] Assignee: Pioneer Electronic Corporation, Tokyo, Japan

[*] Notice: The portion of the term of this patent subsequent to Sep. 15, 1998, has been disclaimed.

[21] Appl. No.: 78,269

[22] Filed: Sep. 24, 1979

[30] Foreign Application Priority Data

Sep. 26, 1978 [JP] Japan .................................. 53-118265
Sep. 26, 1978 [JP] Japan .................................. 53-118266
Sep. 26, 1978 [JP] Japan .................................. 53-118267

[51] Int. Cl.³ .......................... H03G 3/00; H03G 5/00
[52] U.S. Cl. .................................... 330/151; 179/1 D; 330/126; 330/144; 330/284; 330/306; 333/28 T
[58] Field of Search ............... 330/107, 109, 126, 144, 330/145, 151, 284, 294, 302, 303, 304, 306; 328/167; 333/28 R, 28 T; 179/1 D

[56] References Cited

U.S. PATENT DOCUMENTS 3,729,693  4/1973  Dolby ........................... 330/151 X
4,004,253  1/1977  Takasaki et al. ................ 330/151 X Primary Examiner—James B. Mullins
Attorney, Agent, or Firm—Sughrue, Mion, Zinn, Macpeak and Seas

[57] ABSTRACT

A tone control circuit includes a variable gain amplifier circuit, a first mixer combining the variable gain amplifier output with a tone control circuit input and providing its output signal to the variable gain amplifier input, and a second mixer combining the outputs of the first mixer and variable gain amplifier. The mixers may be either adders or subtractors as long as the natural logarithm of the overall gain of the tone control circuit varies substantially linearly with changes in the feedback ratio of the variable gain amplifier.

8 Claims, 9 Drawing Figures

TONE CONTROL CIRCUIT UTILIZING VARIABLE GAIN AMPLIFIER

BACKGROUND OF THE INVENTION

This invention relates to a variable gain amplifier circuit including an operational amplifier circuit.

This invention more specifically pertains to a tone quality regulating device for use in audio equipment such as a stereophonic amplifier.

In a conventional stereophonic amplifier, a tone quality regulation is carried out by directly processing an audio signal by the use of variable resistors or by providing discrete circuits each of which is activated by a corresponding manual switch. However, the former case is disadvantageous in that wiring to the tone control may pick up noise while the latter case is disadvantageous in that the number of circuit elements is high for the function to be performed.

A variable gain amplifier circuit employing a digital control system has been known in the art in which the gain is varied by a digital code signal. Such a variable gain amplifier circuit is as shown in FIG. 1. In FIG. 1 reference character $OP_1$ designates an operational amplifier circuit whose non-inverting input terminal is grounded. A feedback resistor $Rf_1$ is connected between the inverting input terminal and the output terminal of the amplifier circuit $OP_1$. Connected to the input terminal of the amplifier circuit is a parallel circuit of resistors $R_1$, $R_2$, $R_3$ and $R_4$ which are provided in correspondence to the number of bits in the digital code signal, for instance as shown here, four bits. First ends or contacts of analog switches $SW_1$, $SW_2$, $SW_3$ and $SW_4$ are connected to the resistors $R_1$, $R_2$, $R_3$ and $R_4$, respectively, and second contacts of the switches are connected to the inverting input terminal of the operational amplifier $OP_1$. In the circuit thus constructed, the analog switches $SW_1$ through $SW_4$ are subjected to on-off control according to the contents of the four-bit digital code signal so that the amount of feedback to the operational amplifier $OP_1$ is correspondingly changed thereby controlling the gain.

Such a variable gain amplifier circuit has been employed as a so-called "logarithmic amplifier" circuit in which the output voltage is a logarithmic function of the input voltage. However, such use of the circuit is somewhat disadvantageous in that since that system utilizes a polygonal line approximation system, the gain cannot change in a logarithmic linear manner with respect to variations in the amount of feedback of the operational amplifier $OP_1$.

Accordingly, an object of this invention is to provide a variable gain amplifier circuit the gain of which can change in a logarithmic linear manner with respect to variations in the amount of feedback of its associated operational amplifier.

An object of this invention is also to provide a tone quality regulating device capable of eliminating the drawbacks mentioned above which are present in a conventional device of this category.

Hereinafter, an embodiment according to this invention will be described with reference to the accompanying drawing.

SUMMARY OF THE INVENTION

These, as well as other objects of the invention, may be met by a variable gain amplifier circuit including a gain control circuit having an operational amplifier and a feedback loop around the operational amplifier with means for varying the feedback ratio of the operational amplifier in accordance with a predetermined control signal for varying the gain thereof, a first mixer circuit for mixing an input signal with an output signal of the gain control circuit, and a second mixer circuit for mixing the output signal of the gain control circuit with the resultant output signal of the first mixer circuit. As used herein, it is to be understood that the term "mixer" means a circuit which is either an adder circuit or a subtractor circuit and is not intended to refer to a multiplier circuit or the like. Further, the variable gain amplifier circuit of the invention may include a switchable phase inverting circuit for inverting the phase of an input signal coupled to the gain control circuit.

Further, in accordance with the invention, there may be provided a variable gain amplifier circuit including a signal summer circuit, a switchable phase converter circuit having one input receiving an output of the signal summer circuit with the phase inverter circuit producing as an output a signal having the same phase as the input signal to the phase inverter circuit for one state of an input control signal and the opposite phase for a second state of the input control signal, a plurality of resistors each having a different resistance value and each having one terminal coupled to the output of the switchable phase inverter circuit, a plurality of switch means one of which is provided for each of the resistors with each of the resistors having a second terminal coupled to one terminal of each of this switch means with second terminals of the switch means coupled to one another, amplifier means having an input coupled to the second terminals of the switch means with an output of an amplifier means coupled to an input of the signal summer circuit, and a signal subtractor circuit with the output of the amplifier means coupled to one input of the signal subtractor circuit and with the output of the signal summer circuit coupled to a second input of the signal subtractor circuit. This variable gain amplifier may further include a resistor coupled between the output of the switchable phase inverter circuit and the first terminals of the plurality of resistors.

Still further in accordance with the objects of the present invention, there may be provided a tone quality regulating circuit including an active circuit having a predetermined frequency response characteristic, a gain control circuit including an operational amplifier and means for varying a feedback ratio of the operational amplifier in accordance with a predetermined control signal for varying the gain of the operational amplifier with the gain control circuit being connected in series with the active circuit to form a series-connected circuit, a first mixer circuit for mixing an input signal with an output signal of the series-connected circuit, an output signal from the first mixer circuit being coupled to an input terminal of the series-connected circuit, and a second mixer circuit for mixing the output signal of the series-connected circuit with the output of the first mixer circuit. Such a tone quality regulating circuit may further include a switchable phase inverting circuit for inverting the phase of a signal within the series-connected circuit. Still further, this circuit may include a plurality of resistor-switch pairs coupled in parallel with one another with the parallel combinations coupled in series with the input of the gain control circuit.

DESCRIPTION OF THE PREFERRED EMBODIMENTS OF THE INVENTION

In the analysis which follows, it is assumed that the gain of the variable gain amplifier is represented by G (output voltage $e_o$/input voltage $e_i$), and the amount of feedback of the operational amplifier is represented by x. Then, in order for the gain G to change in a logarithmic linear manner with respect to variations in the amount of feedback x, the following equation (1) must be established:

$$\ln G = ax, \tag{1}$$

where a is a constant.

In order to implement the equation (1), the following equation (2) is considered:

$$G = \frac{1 + x}{1 - x} \quad \text{(where } |x| < 1\text{)}. \tag{2}$$

If logarithms of both sides of the equation (2) are taken, then $$\ln G = \ln\left(\frac{1 + x}{1 - x}\right). \tag{3}$$

If the right side of the equation (3) is approximated by the first term of its series expansion, then $$\ln\left(\frac{1 + x}{1 - x}\right) \doteq 2x. \tag{4}$$

From the equations (3) and (4), $$\ln G \doteq 2x. \tag{5}$$

Thus, it can be seen from the equation (5) that the value G changes approximately in a logarithmic linear manner with linear changes in the value x.

The invention implements the equation (2) in a circuit in which the gain thereof changes in a logarithmic linear manner with variations in the amount of feedback of the operation amplifier.

Figure 2:
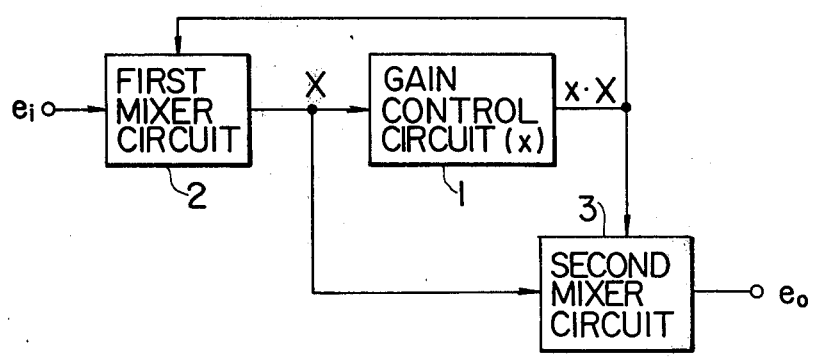
FIG. 2 is a block circuit diagram of a first embodiment of a variable gain amplifier circuit in accordance with the invention.

FIG. 2 is a block diagram showing a variable gain amplifier circuit according to the invention which is obtained by implementing the equation (2) by using a conditional variable X.

If the denominator and the numerator of the equation (2) are multiplied by such a conditional variable X, then the following equation (6) is obtained:

$$G = \frac{e_o}{e_i} = \frac{X + x \cdot X}{X - x \cdot X}. \tag{6}$$

From the equation (6), $$X = e_i + x \cdot X \tag{7}$$

$$e_o = X + x \cdot X \tag{8}$$

The equations (7) and (8) are implemented in a circuit, as shown in FIG. 2.

In FIG. 2, reference numeral 1 designates a gain control circuit having a feedback factor x. The gain control circuit 1 provides an output $x \cdot X$ in response to an input representative of the conditional variable X. The output $x \cdot X$ is mixed with an input voltage $e_i$ in a first mixer circuit 2 and is also mixed with the condition variable X. As a result of the latter, an output voltage $e_o$ is produced.

Figure 3:
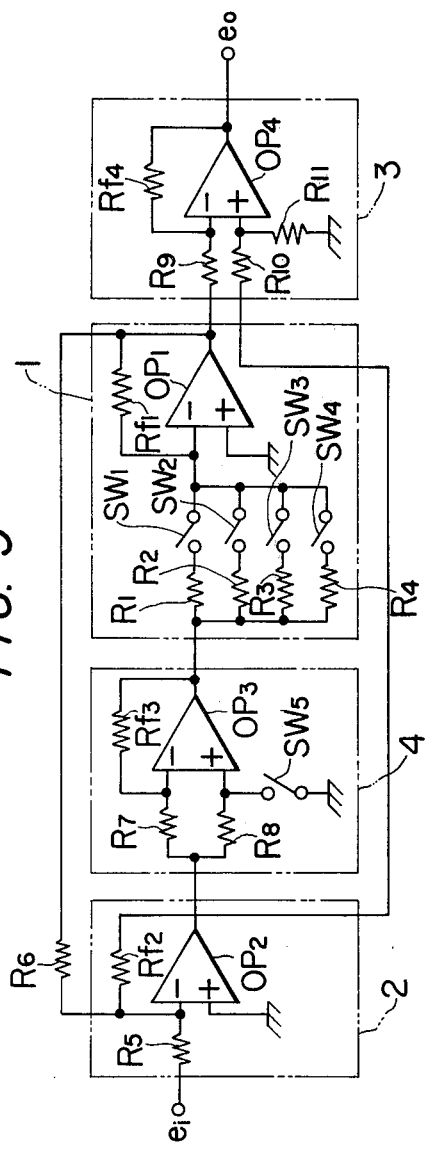
FIG. 3 is a detailed schematic diagram of the circuit shown in FIG. 2.

FIG. 3 is a circuit diagram showing a preferred embodiment of the circuit shown in FIG. 2. In FIG. 3, those components which have been previously described with reference to FIG. 2 are therefore similarly numbered.

In FIG. 3, a first mixer circuit 2 includes an operational amplifier $OP_2$ whose non-inverting input terminal is grounded, a resistor $R_5$ connected to the inverting input terminal of the amplifier $OP_2$, and a feedback resistor $Rf_2$ connected between the inverting input terminal and the output terminal of the amplifier $OP_2$. In the first mixer circuit 2, the output signal of a gain control circuit to be described, which is supplied thereto through a resistor $R_6$, is mixed with an input signal $e_i$.

Reference numeral 4 designates a phase switching circuit adapted to switch the phase of the output signal of the first mixer circuit 2. The phase switching circuit 4 includes an operational amplifier $OP_3$, a feedback resistor $Rf_3$ connected between the inverting input terminal and the output terminal of the operational amplifier $OP_3$, resistors $R_7$ and $R_8$ connected respectively to the inverting input terminal and the non-inverting input terminal of the amplifier $OP_3$, and, for example, an analog switch $SW_5$ connected between the non-inverting input terminal of the amplifier $OP_3$ and ground. In the phase switching circuit 4, an output signal in phase with the input signal is produced when the analog switch $SW_5$ is turned off and an output signal opposite in phase to the input signal is produced when the analog switch $SW_5$ is turned on. Accordingly, amplification and attenuation can be readily switched. However, provision of the phase switching circuit is not always required.

Figure 1:
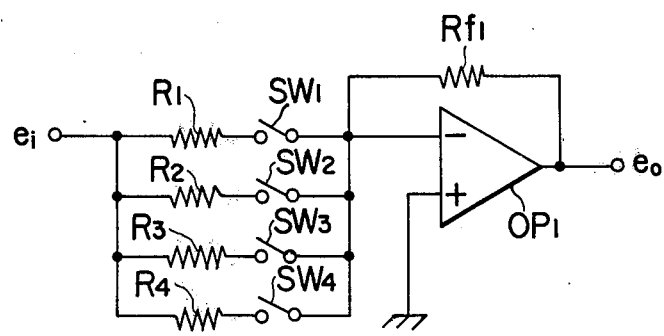
FIG. 1 is a circuit diagram of a prior art amplifier circuit employing a digital control system.

The basic arrangement of the gain control circuit 1 is the same as that of the circuit shown in FIG. 1. The resistors $R_1$, $R_2$, $R_3$ and $R_4$ form a weight tree having resistances R, R/2, R/4 and R/8.

A second mixer circuit 3 includes an operational amplifier $OP_4$, a feedback resistor $Rf_4$ connected between the inverting input teminal and the output terminal of the operational amplifier $OP_4$, a resistor $R_9$ connected between the inverting input terminal of the amplifier $OP_4$ and the output terminal of the gain control circuit 1, a resistor $R_{10}$ connected between the non-inverting input terminal the amplifier $OP_4$ and the output terminal of the first mixer circuit 2, and a resistor $R_{11}$ connected between the non-inverting input terminal of the amplifier $OP_4$ and ground. In the above-described example, the circuit connections are such that the first mixer circuit 2 functions as an adder while the second mixer circuit 3 functions as a subtractor. However, if the polarity so permits, the arrangement may be so modified that the first mixer circuit 2 functions as a subtractor while the second mixer circuit functions as an adder.

Figure 4:
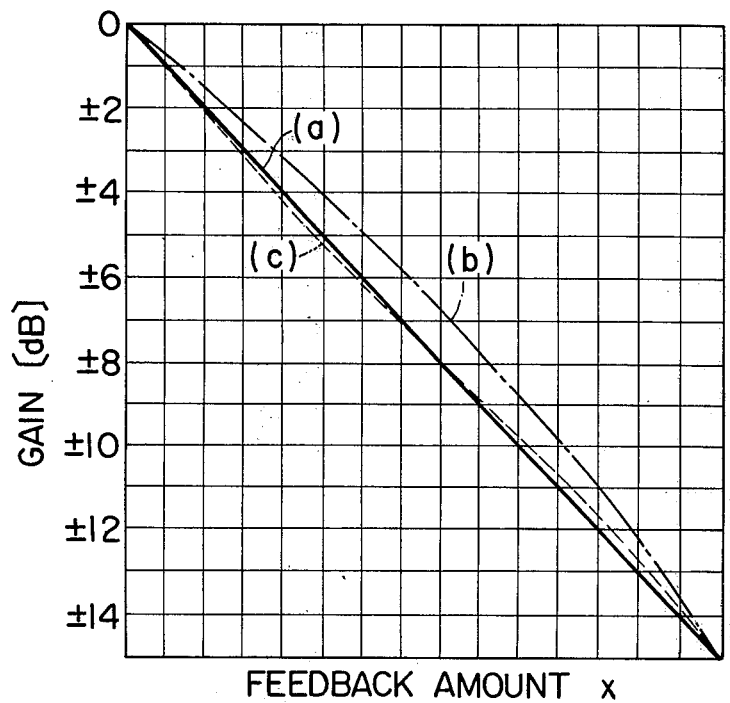
FIG. 4 is a frequency response graph showing the frequency response characteristics of circuits in accordance with the invention as compared with an ideal characteristic.

In the variable gain amplifier circuit thus constructed, the amount of feedback x of the operational amplifier $OP_1$ is changed by controlling the on-off operations of the analog switches $SW_1$ through $SW_4$ according to the contents of a digital code signal as described before. With reference to FIG. 4, the gain as it varies with respect to the amount of feedback x follows the curve (b) instead of the ideal logarithmic linear curve (a). It is obvious that the deviation from the ideal logarithmic linear curve (a) is an approximation error attributed to dropping of the second, third and subsequent term of the above-described equation (4). However, if, for example, the variable gain amplifier circuit were to be employed as a tone quality adjusting circuit in a stereophonic amplifier, the characteristics thereof would be much improved when compared with a conventional circuit.

Figure 5:
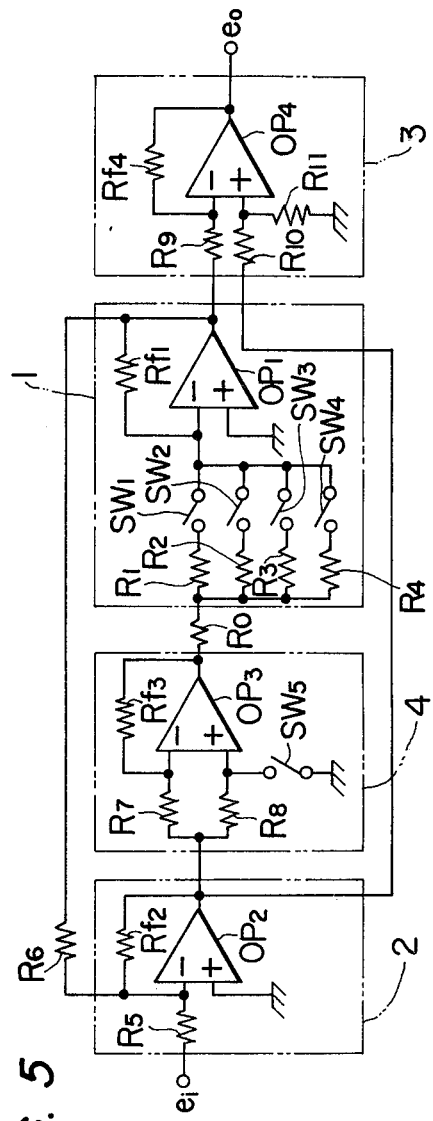
FIG. 5 is a detailed schematic diagram of a second embodiment of the circuit shown in FIG. 2.

A second example of a variable gain amplifier circuit according to the invention is as shown in FIG. 5, in which the approximation error of the first example is corrected to permit the characteristic to more closely approach the ideal logarithmic linear characteristic. A specific remarkable feature of the second example resides in the fact that a resistor $R_0$ is inserted between the first mixer circuit 2 and the gain control circuit 1. That is, the circuitry of the second example shown in FIG. 5 is completely the same as that of the first example shown in FIG. 3 except for the provision of the resistor $R_0$ described above.

Accordingly, in the second example also the amount of feedback x of the operational amplifier $OP_1$ is changed by controlling the on-off operation of the analog switches $SW_1$ through $SW_4$ according to the contents of the digital code signal as described above. As shown in FIG. 4, the gain change with respect to variations in the amount of feedback x as indicated by the curve (c) is closer to the ideal logarithmic linear curve (a) than in the preceding example.

As is apparent from the above description, with the variable gain amplifier circuit according to the invention, the gain changes in a closely logarithmic linear manner with respect to the variation in the amount of feedback under digital control. Accordingly, the variable gain amplifier circuit can be effectively employed, as an example, as a tone quality adjusting circuit in a stereophonic amplifier.

Examples of this invention as applied specifically to a tone control circuit in a stereophonic receiver will now be described.

Figure 6:
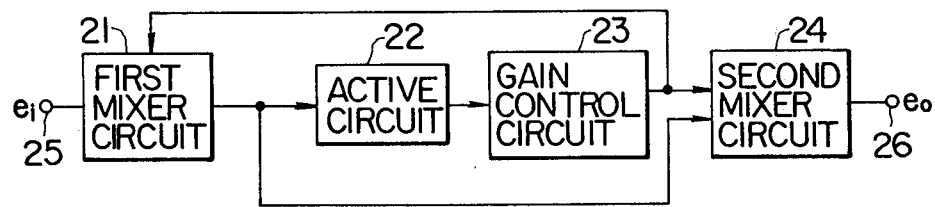
FIG. 6 is a block schematic diagram of a tone quality control circuit in accordance with the present invention.

FIG. 6 is a block diagram showing one such embodiment of the invention wherein reference numeral 21 designates a first mixer circuit, reference numeral 22 an active circuit having a transfer characteristic of $H(j\omega)$ determined by a desired tonal quality regulation range, reference numeral 23 a gain control circuit, reference numeral 24 a second mixer circuit, reference numeral 25 an input terminal, and reference numeral 26 an output terminal. In this embodiment, assuming that the input voltage applied to the input terminal 25 is $e_i$, the output voltage on the output terminal 26 is $e_0$, the ratio or amount of feedback of the gain control circuit 23 to the first mixer circuit 21 is x, and the transfer characteristic is $Tm(j\omega)$ when the transfer characteristic exhibits a minimum value within the range of amplitude transfer characteristics to be controlled, the following equation is obtained:

$$H(j\omega) = \frac{1 - Tm(j\omega)}{1 + Tm(j\omega)} \tag{11}$$

where a transfer characteristic $H(j\omega)$ of the active circuit 22 is determined such that the gains of the mixer circuit 21 and 24 are unity.

The output voltage $V_0$ of the first mixer circuit and the output voltage on output terminal 26 are expressed as follows:

$$e_i - V_0 \cdot H(j\omega) \cdot x = V_0, \tag{12}$$

$$V_0 - V_0 \cdot H(j\omega) \cdot x = e_0. \tag{13}$$

From the equation (12) and (13), an input and output transfer characteristic $T(j\omega)$ can be expressed as follow:

$$T(j\omega) = \frac{e_o}{e_i} = \frac{1 - H(j\omega) \cdot x}{1 + H(j\omega) \cdot x} \tag{14}$$

In this equation (14), assuming that $|H(j\omega) \cdot x| < 1$, that is $|x| < 1$, $$\ln T(j\omega) = \ln \frac{1 - H(j\omega) \cdot x}{1 + H(j\omega) \cdot x} \tag{15}$$

If the right side of the equation (15) is approximated as before by the first term of its series expansion, then, $$\ln T(j\omega) \doteqdot x \cdot \ln \frac{1 - H(j\omega)}{1 + H(j\omega)}. \tag{16}$$

In the equation (16), $H(j\omega)$ is replaced by the equation (11), so that:

$$\ln T(j\omega) \doteqdot x \cdot \ln Tm(j\omega). \tag{17}$$

In the above equation (17), taking into account only the amplitude characteristics:

$$\ln |T(j\omega)| \doteqdot x \cdot \ln |Tm(j\omega)|. \tag{18}$$

Figure 7:
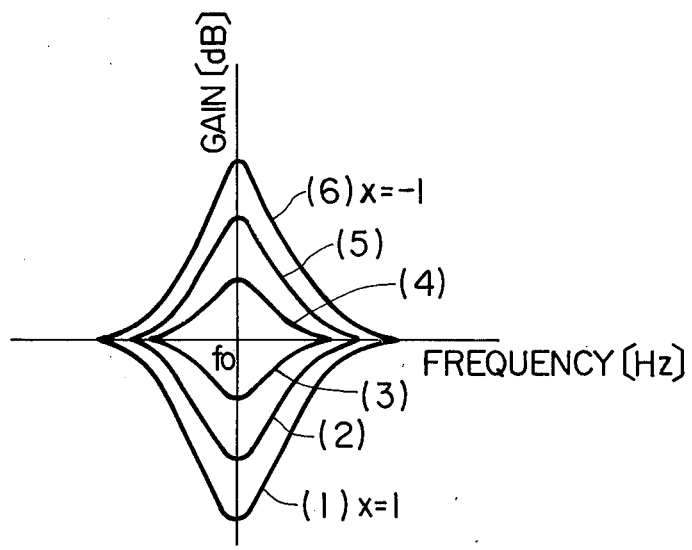
FIG. 7 is a frequency response diagram showing the gain and frequency characteristics of an amplifier circuit constructed in accordance with the teachings of the present invention.

As is apparent from the equations (16) to (18), the logarithm of the transfer characteristic $H(j\omega)$ is proportional to the amount x of feedback of the gain control circuit 23 with respect to the transfer characteristic $Tm(j\omega)$ as determined by $H(j\omega)$. For example, in the case where $H(j\omega)$ is determined such that the absolute value of $Tm(j\omega)$ is as indicated by a characteristic curve (1) shown in FIG. 7, then $|T(j\omega)|$ with respect to the amount of feedback x exhibits the characteristic curves (1) to (6) shown in FIG. 7.

Figure 8:
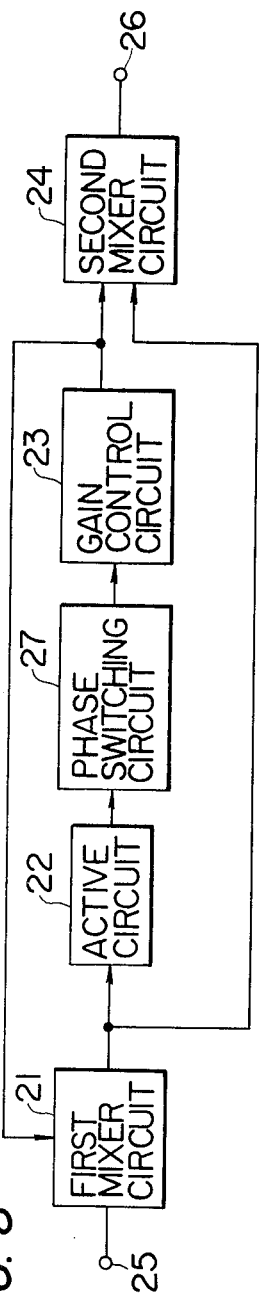
FIG. 8 is an alternative embodiment of a tone quality control circuit of the invention.

FIG. 8 is a block diagram showing yet another embodiment of this invention, where circuit elements which have been previously described with reference to FIG. 6, are thus designated by the same reference numerals. In FIG. 8, reference numeral 27 designates a phase switching circuit which was not shown in FIG. 6. The phase switching circuit 27 inverts the phase of the signal applied to the input of the gain control circuit 23 in response to a predetermined suitable control signal to provide switching between an amplification mode and an attenuation mode.

By varying the feedback ratio x of the gain control circuit 23, regulation of the frequency characteristics is possible over a wide range. It should be noted that the order of connection of the active circuit 22, the phase switching circuit 27 and the gain control circuit 23 can be changed while yet maintaining the same operational results.

Figure 9:
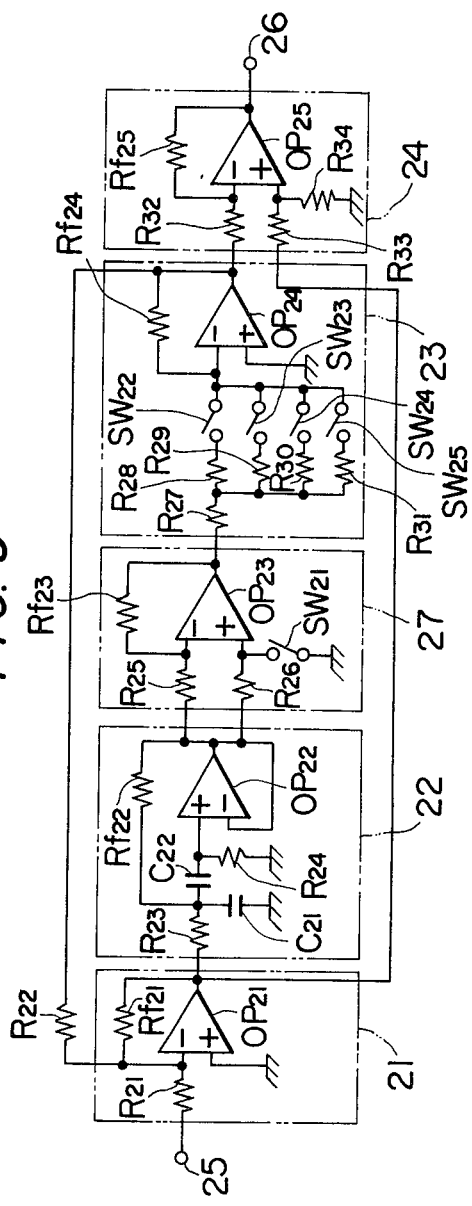
FIG. 9 is a detailed schematic diagram of a tone quality control circuit in accordance with the invention.

FIG. 9 is a schematic circuit diagram showing an example of the embodiment according to the invention shown in FIG. 8 except that mixer 21 is an adder rather than a subtractor as in FIG. 6. In FIG. 9, a first mixer circuit 21 includes an operational amplifier $OP_{21}$ whose non-inverting input terminal is grounded, a resistor $R_{21}$ connected to the inverting input terminal of the amplifier $OP_{21}$, and a feedback resistor $Rf_{21}$ connected between the inverting input terminal and the output terminal of the amplifier $OP_{21}$. In the first mixer circuit 21, the output signal of the gain control circuit 23 is supplied through a resistor $R_{22}$ thereto which is then mixed with an input signal $e_i$. The active circuit 22 includes an operational amplifier $OP_{22}$ whose inverting input terminal and output terminal are connected together, a resistor $R_{23}$ connected to the non-inverting input terminal of the operational amplifier $OP_{22}$ a band-pass filter including a resistor $R_{24}$ and capacitors $C_{21}$ and $C_{22}$, and a feedback resistor $Rf_{22}$. The phase switching circuit 27 includes an operational amplifier $OP_{23}$, a feedback resistor $Rf_{23}$ connected between the inverting input terminal and the output terminal of the operational amplifier $OP_{23}$, resistors $R_{25}$ and $R_{26}$ connected respectively to the inverting input terminal and the non-inverting input terminal of the amplifier $OP_{23}$, and a switch $SW_{21}$, for example an analog switch, connected between the non-inverting input terminal of the amplifier $OP_{23}$ and ground. In the phase switching circuit 27, an output signal having the same phase as the input signal is produced when the switch $SW_{21}$ is turned off and an output signal opposite in phase to the input signal is produced when the switch $SW_{21}$ is turned on.

In the gain control circuit 23, the non-inverting input terminal of an operational amplifier $OP_{24}$ is grounded whereas the inverting input terminal thereof is connected to the output terminal thereof through a feedback resistor $Rf_{24}$. Connected between an input resistor $R_{27}$ and the inverting input terminal of the operational amplifier $OP_{24}$ is a parallel circuit of resistors $R_{28}$ to $R_{31}$ and analog switches $SW_{22}$ to $SW_{25}$ connected in series with the resistors $R_{28}$ to $R_{31}$, respectively. The number of resistors $R_{28}$ to $R_{31}$ corresponds to the number of bits of the digital code signal, for instance four bits. The resistors $R_{28}$ to $R_{31}$ form a weight resistance tree having resistance values R, R/2, R/4 and R/8. In the thus constructed gain control circuit, the analog switches $SW_{22}$ to $SW_{25}$ are subjected to on-off control according to the contents of the four-bit digital code signal so that the amount of feedback to the operational amplifier $OP_{24}$ is varied to thereby control the gain.

A second mixer circuit 24 includes an operational amplifier $OP_{25}$, a feedback resistor $Rf_{25}$ connected between the inverting input terminal and the output terminal of the operational amplifier $OP_5$, a resistor $R_{32}$ connected between the inverting input terminal of the amplifier $OP_{24}$ and the output terminal of the gain control circuit 23, a resistor 33 connected between the non-inverting input terminal of the amplifier $OP_{25}$ and the output terminal of the first mixer circuit 1, and a resistor $R_{34}$ connected between the non-inverting input terminal of the amplifier $OP_{24}$ and ground. In the above-described example, the circuit connections are such that the first mixer circuit 1 functions as an adder while the second mixer circuit 4 functions as a subtractor. However, if the polarities are proper, the circuit arrangement may be so modified that the first mixer circuit 1 functions as a subtractor while the second mixer circuit 4 functions as an adder.

In the tone control device thus constructed, the amount or ratio of feedback x of the operational amplifier $OP_{24}$ can be varied by controlling the on-off operations of the analog switches $SW_{22}$ through $SW_{25}$ according to the contents of the digital code signal as described above. Gain characteristics which have a logarithmic linear variation with respect to the amount of feedback x can be obtained. In the phase switching circuit 27, amplification and attenuation can be readily switched by simple on-off control of analog switch $SW_1$.

As is apparent from the above description, with the tone control device according to the invention, the gain changes in a logarithmic linear manner with variations in the amount of feedback as determined by the digital control. Therefore, it is possible to externally determine the frequency characteristics of signals processed with the circuit and further it is possible to provide an excellent tone quality controlling device which is not susceptible to interference from undesirable noise components such as hum noise.

What is claimed is:

1. A variable gain amplifier circuit for receiving a first input signal and providing a first output signal, said circuit comprising:

a gain control circuit having a feedback ratio x and comprising an operational amplifier circuit with a feedback loop and means for varying the feedback ratio of said operational amplifier in accordance with a predetermined control signal for varying the gain thereof;

a first mixer circuit for mixing said first input signal with an output signal of said gain control circuit and for coupling the resultant output signal to a signal input of said gain control circuit; and a second mixer circuit for mixing said output signal of said gain control circuit with said resultant output signal of said first mixer circuit, the output of said second mixer comprising said first output, said variable gain amplifier circuit having a ratio G of said first output signal to said first input signal which varies in a substantially logarithmic linear manner with variations in said feedback ratio.

2. A variable gain amplifier circuit as claimed in claim 1, further comprising switchable phase inverting circuit means for inverting the phase of an input signal coupled to said gain control circuit.

3. The variable gain amplifier circuit of either claim 1 or 2 wherein one of said first and second mixing circuits comprises a subtractor and the other an adder.

4. A variable gain amplifier circuit for receiving a first input signal and providing a first output signal, said circuit comprising:
a signal summer circuit receiving said first input signal as one input;
a switchable phase inverter circuit having an input receiving an output of said signal summer circuit, said phase inverter circuit producing as an output a signal having the same phase as the input signal to said phase inverter circuit for one state of an input control signal and the opposite phase for a second state of said input control signal;
a plurality of resistors each having a different resistance value and each having one terminal coupled to said output of said switchable phase inverter circuit;
a plurality of switch means, one of said switch means being provided for each of said resistors, and each of said resistors having a second terminal coupled to one terminal of each of said switch means and second terminals of said switch means being coupled to one another;
amplifier means having an input coupled to said second terminals of said switch means, an output of said amplifier means being coupled to an input of said signal summer circuit said amplifier means having a variable feedback ratio x; and
a signal subtractor circuit, said output of said amplifier means being coupled to one input of said signal subtractor circuit and said output of said signal summer circuit being coupled to a second input of said signal subtractor circuit, the output of said signal subtractor circuit comprising said first output, said variable gain amplifier circuit having a ratio G of said first output signal to said first input signal which varies in a substantially logarithmic linear manner with variations in said feedback ratio.

5. The variable gain amplifier circuit of claim 4 further comprising a resistor coupled between said output of said switchable phase inverter circuit and said first terminals of said plurality of resistors.

6. A tone quality regulating circuit receiving a first input signal and providing a first output signal, said circuit comprising:
an active circuit having a predetermined frequency response characteristic;
a gain control circuit comprising an operational amplifier and means for varying a feedback ratio of said operational amplifier in accordance with a predetermined control signal for varying the gain of said operational amplifier, said gain control circuit being connected in series with said active circuit to form a series-connected circuit;
a first mixer circuit for mixing said first signal with an output signal of said series-connected circuit, an output signal from said first mixer circuit being coupled to an input terminal of said series circuit; and
a second mixer circuit for mixing the output signal of said series-connected circuit with the output of said first mixer circuit, the output signal of said second mixer circuit comprising said first output signal, said tone quality regulating circuit having a ratio G of said first output signal to said first input signal which varies in a substantially logarithmic linear manner with variations in said feedback ratio.

7. The tone quality regulating circuit of claim 6, further comprising a switchable phase inverting circuit for inverting the phase of a signal in said series-connected circuit.

8. The tone quality regulating circuit for either claim 1 or 7 wherein said means for varying the feedback ratio of said operational amplifier comprises a plurality of resistors and a plurality of switches, each one of said switches being coupled in series with one of said resistors, the pairs of said resistors and switches being coupled in parallel with one another and said pairs so coupled being coupled in series with an input of said gain control circuit.

* * * * *